United States Patent
Huang et al.

(10) Patent No.: US 9,618,734 B2
(45) Date of Patent: Apr. 11, 2017

(54) OPTICAL COMPONENTS EXPOSER SET HAVING NON-SPHERICAL COMPONENT

(71) Applicant: National Applied Research Laboratories, Taipei (TW)

(72) Inventors: Jiun-Woei Huang, Taipei (TW); Shih-Feng Tseng, Hsinchu County (TW); Jer-Liang Andrew Yeh, Hsinchu County (TW)

(73) Assignee: NATIONAL APPLIED RESEARCH LABORATORIES, Hsinchu (TW)

(*) Notice: Subject to any disclaimer, the term of this patent is extended or adjusted under 35 U.S.C. 154(b) by 26 days.

(21) Appl. No.: 14/741,550

(22) Filed: Jun. 17, 2015

(65) Prior Publication Data
US 2016/0370563 A1    Dec. 22, 2016

(51) Int. Cl.
| G02B 17/00 | (2006.01) |
| G02B 17/08 | (2006.01) |
| G02B 13/18 | (2006.01) |
| G02B 27/00 | (2006.01) |
| G03F 7/20  | (2006.01) |

(52) U.S. Cl.
CPC ......... *G02B 17/0832* (2013.01); *G02B 13/18* (2013.01); *G02B 27/0025* (2013.01); *G03F 7/7015* (2013.01)

(58) Field of Classification Search
CPC .................................................. G02B 17/0832
USPC .................................................. 359/726–731
See application file for complete search history.

(56) References Cited

U.S. PATENT DOCUMENTS

2013/0321935 A1* 12/2013 Stites .................. G03F 7/70225
359/728

* cited by examiner

*Primary Examiner* — James Jones
(74) *Attorney, Agent, or Firm* — Jackson IPG PLLC; Demian K. Jackson

(57) ABSTRACT

A common optical components exposer lens set having a single non-spherical surface, comprising a common optical element set, comprising a first, second, and third lens arranged sequentially; a spherical reflecting mirror, arranged below the third spherical lens; and a planar reflecting lens, comprising a first and second planar reflecting, inclinedly arranged above the first lens, so that an equi-multiplication exposer lens set is formed by the spherical mirror set, so as to impinge a pattern on an object onto a photosensitive surface. As such, a single non-spherical surface and overlapping assembly, composed of three lenses having the single non-spherical surface and a spherical reflecting lens and two planar reflecting lenses overlapping together, in which two optical material types are arranged with respect to each other.

7 Claims, 8 Drawing Sheets

OPTICAL COMPONENTS EXPOSER SET HAVING NON-SPHERICAL COMPONENT

FIELD OF THE INVENTION

The present invention relates to a common optical components exposer lens set having a single non-spherical surface, and particularly to such exposer lens set having an overlapping assembly and composed of three lenses having the single no-spherical surface and an overlapping of a spherical reflecting lens and two planar reflecting lens, and more particularly to such exposer lens set where the three lens and two optical material types arranged with respect to one another.

DESCRIPTION OF THE RELATED ART

An exposer lens set is an important secondary system for an exposer for manufacture of electronic devices. However, the currently available exposer lens sets are all full refractive lens and long optical extended lens. The former has a large volume, and the latter may reduce the number of devices, but it adopts multiple faces and thus involves a difficult manufacture and assembly.

The long optical extended exposer lens set may be seen in the ASML fashion manufactured by a Germany company ZEISS, with the counterpart patents DE9355198 and DE19922209; and in the folded symptotic curvature fashion manufactured by a Japan company NIKON, as shown in FIG. 7.

In addition, to save the used material, a French company Thales Group adopts the DYSON return fashion to reduce a light path, so that the light returns back and forth in the mirror sets 40, 50, also seen in its counterpart Chinese patent CN101171546. Thus, the number of mirrors 40, 50 may be reduced. However, the mirror sets 40, 50 and the reflecting faces 20, 22 have to be non-spherical faces, as shown in FIG. 8. In addition, the lithography lens set proposed by Shanghai Micro-Electromechanical Co., having the counterpart US patent U.S. Pat. No. 7,746,571 B2, also uses the similar fashion, i.e. the long optical extended, to achieve the lithography function. However, the technologies all adopt multiple non-spherical mirrors in the above patents, requiring a difficult manufacture and assembly, which also involves a high precision and thus a high cost. Therefore, the prior art lithography sets still have a requirement for improvement to satisfy a user's actual use.

The long optical extended lithography lens set may be seen in the ASML fashion manufactured by a Germany company ZEISS, with the counterpart patents DE9355198 and DE19922209; and in the folded symptomatic curvature fashion manufactured by a Japan company NIKON, as shown in FIG. 7.

In addition, to save the used material, a French company Thales Group adopts the DYSON return fashion to reduce a light path, so that the light returns back and forth in the mirror sets 40, 50, also seen in its counterpart Chinese patent CN101171546. Thus, the number of mirrors 40, 50 may be reduced. However, the mirror sets 40, 50 and the reflecting faces 20, 22 have to be non-spherical faces, as shown in FIG. 8. In addition, the lithography lens set proposed by Shanghai Micro-Electromechanical Co., having the counterpart US patent U.S. Pat. No. 7,746,571 B2, also uses the similar fashion, i.e. the long optical extended, to achieve the lithography function. However, the technologies all adopt multiple non-spherical lens in the above patents, requiring a difficult manufacture and assembly, which also involves a high precision and thus a high cost. Therefore, the prior art exposer sets still have a requirement for improvement to satisfy a user's actual use.

SUMMARY OF THE INVENTION

It is, therefore, an object of the present invention to overcome the issues encountered in the prior art and set forth a common optical components exposer lens set having a non-planar and overlapping assembly, which is composed of three lenses having a single non-spherical face, a spherical reflecting lens, and two planar reflecting lenses overlapping together, with two types of optical material disposed with respect to each other.

It is a secondary object of the present invention to set forth a common optical components exposer lens set, in which only a single non-spherical optical axis exists, resulting in a simple optical system adjustment and calibration factor, thereby the function of the exposer lens may be easier to be achieved, and have a direct effect on the manufacturing cost, and the efficacies of reduced component number, easier manufacture of the optical components (satisfied with the lens manufacturing's experience equation), easier calibration, reduced chromatic abberation, optimized aperture F/#, and a reduced cost.

According to the present invention, the single non-spherical common optical components exposer lens set, comprising a common optical component set, comprising a first lens, a second lens, and a third lens arranged sequentially, forming a tri-lens, the first lens being non-spherical, the first and third lens having a positive curvature while the second lens having a negative curvature, the first and third lens having a curvature ratio ranged between 3 and 4, the third and second lenses having a curvature ratio ranged between −1 and 2.5, each of adjacent lens among the first, second, and third lens having a pitch smaller than a pitch between the third lens and a reflecting lens set; a spherical reflecting mirror, arranged below the third spherical mirror, to reflect a light path and control a dimension of a numerical aperture; and a planar reflecting mirrors, comprising a first planar reflecting lens and a second planar reflecting lens, inclinedly arranged above the first lens to guide a light path, so that an equi-multiplication exposer lens set is formed by the spherical mirror set, so as to impinge a pattern on an object onto a photosensitive surface after being focused by the spherical reflecting mirror, the common optical components, and the set planar reflecting mirrors.

In an embodiment, the common optical component set is calibrated for an aberration thereof.

In an embodiment, the object is an exposure mask or a write light source.

In an embodiment, a light corresponding to the pattern on the object is focused by passing through the first planar reflecting lens, the common optical component set, the spherical reflecting lens, and the second planar reflecting lens, wherein after the light enters the first, second and third lens having a non-spherical face at a side thereof, of the common optical component set, the light passes through the spherical reflecting lens and travels through the third, second, and first lens in a reverse direction of the common optical component set, and finally passes through the second planar reflecting lens, so as to impinge the pattern on the object onto the photosensitive surface.

In an embodiment, the conjugate common light path exposer lens set is applicable to a collimated image projector.

In an embodiment, the planar reflecting lens set is selectable to be replaced with a prism or an extended image lens set.

In an embodiment, the first, second, and third lenses are selectable to be replaced with a lens cone to form an optical system assembly having a primary system.

BRIEF DESCRIPTIONS OF THE DRAWINGS

The present invention will be better understood from the following detailed descriptions of the preferred embodiments according to the present invention, taken in conjunction with the accompanying drawings, in which.

DESCRIPTION OF THE PREFERRED EMBODIMENTS

Referring to FIG. 1 through FIG. 6, a schematic diagram of an extrusion coating according to the present invention, a schematic diagram of a screen printing according to the present invention; a schematic diagram of a color printing according to the present invention, a schematic diagram of a paper material trim according to the present invention, a schematic diagram of a concurrent forming and foaming according to the present invention, and a schematic diagram of a cross sectional view of a bubbler according to an embodiment of the present invention are shown, respectively.

Figure 1:
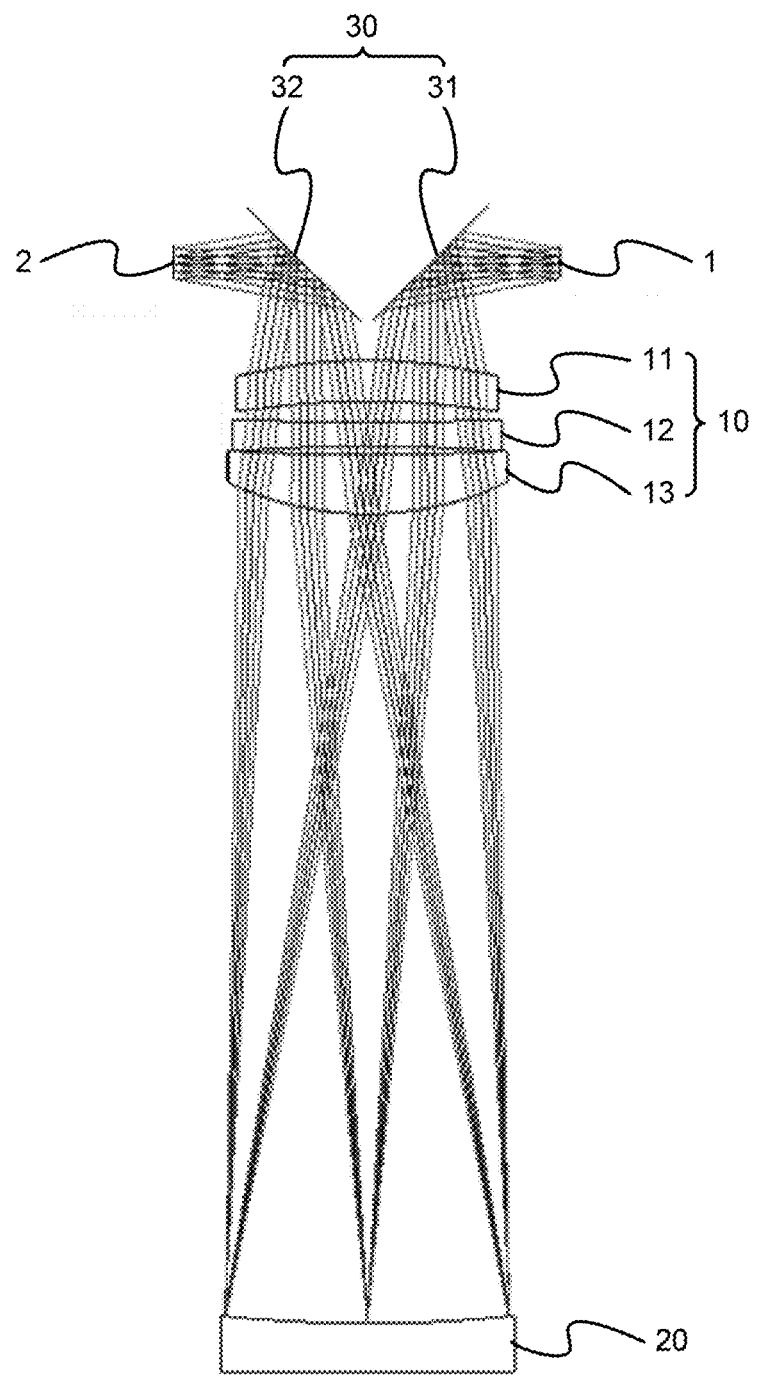
FIG. 1 is a schematic diagram of a cross sectional view of a common optical components exposer lens set according to a first preferred embodiment.
Figure 2:
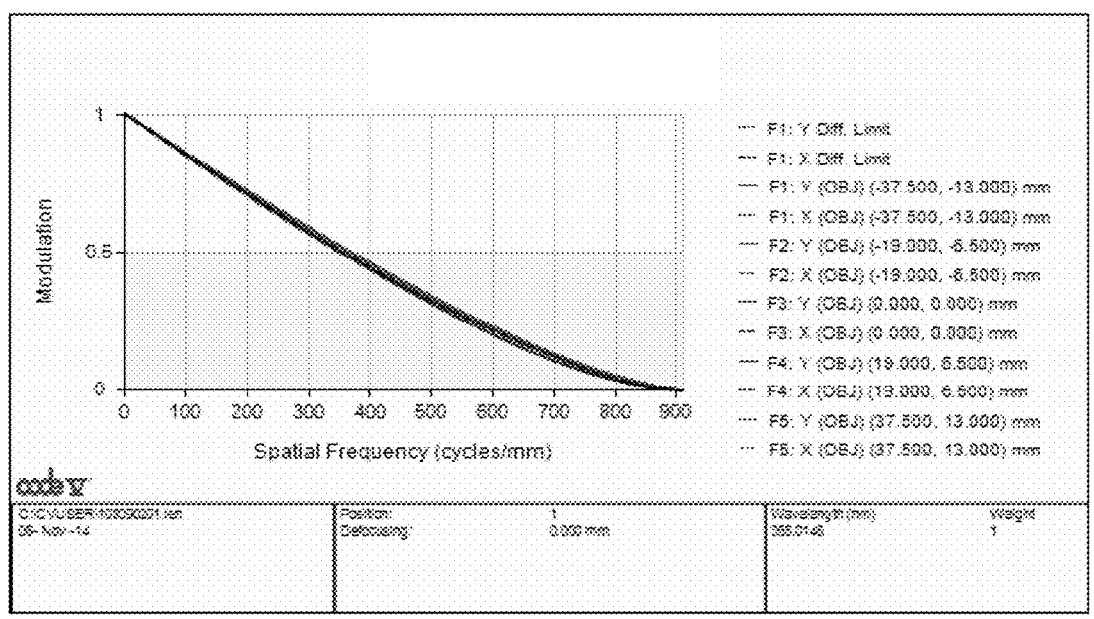
FIG. 2 is a diffraction modulation transfer function curve of the common optical components exposer lens set according to the present invention.
Figure 3:
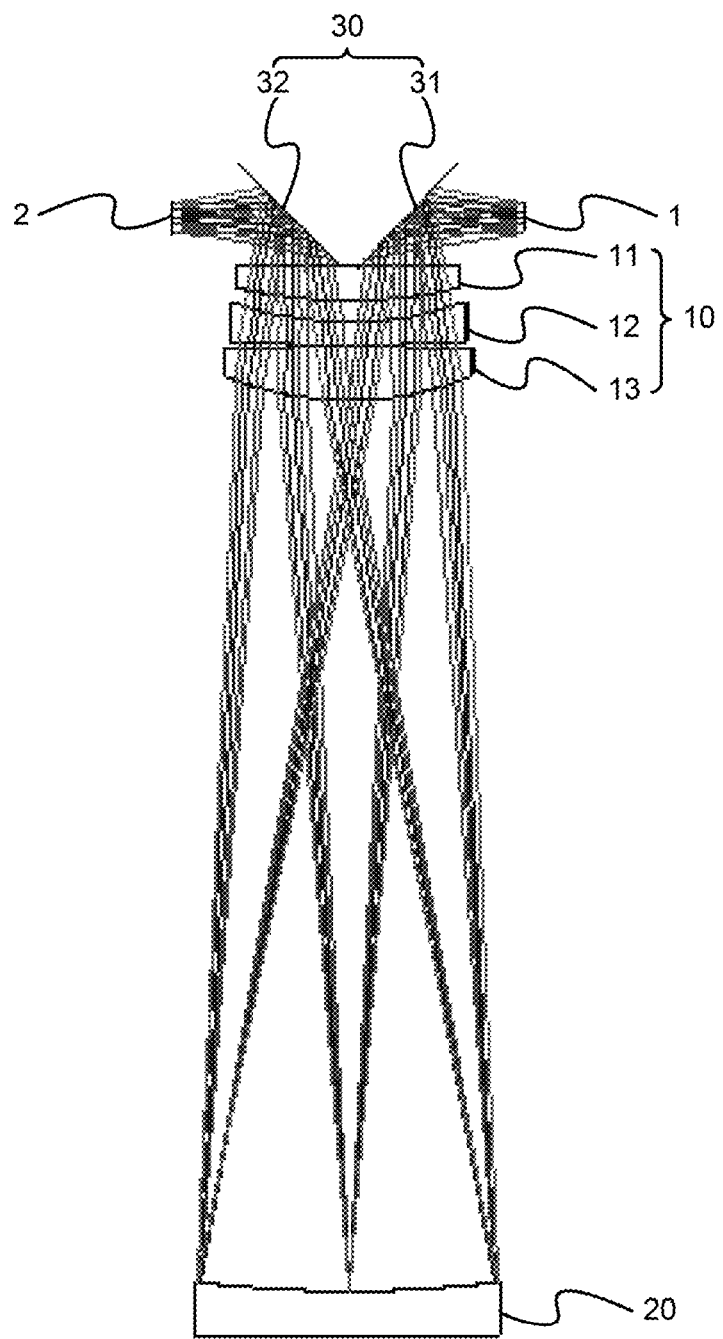
FIG. 3 is a schematic diagram of a cross sectional view of the common optical components exposer lens set according to a second preferred embodiment of the present invention.

At first, a paper material 10 is prepared, an extrusion coating process is applied onto a first surface 101 of the paper material 10, a polypropylene (PP) material is laminated onto the first surface 101 of the paper material 10 to form a PP, PE or CPET film 2, as is shown in FIG. 1.

Next, a second surface 102 of the paper material 10 is subject a screen printing process, a hydrophilic polyurethane (PU) foaming material is screen printed onto the second surface 102 of the paper material 10 to form a hydrophilic PU foaming film 3.

Thereafter, a print material is color printed onto the hydrophilic foaming film 3 to form a pattern layer 4 by using a ultraviolet (UV) printing, an off-set printing, or a general ink printing.

Figure 4:
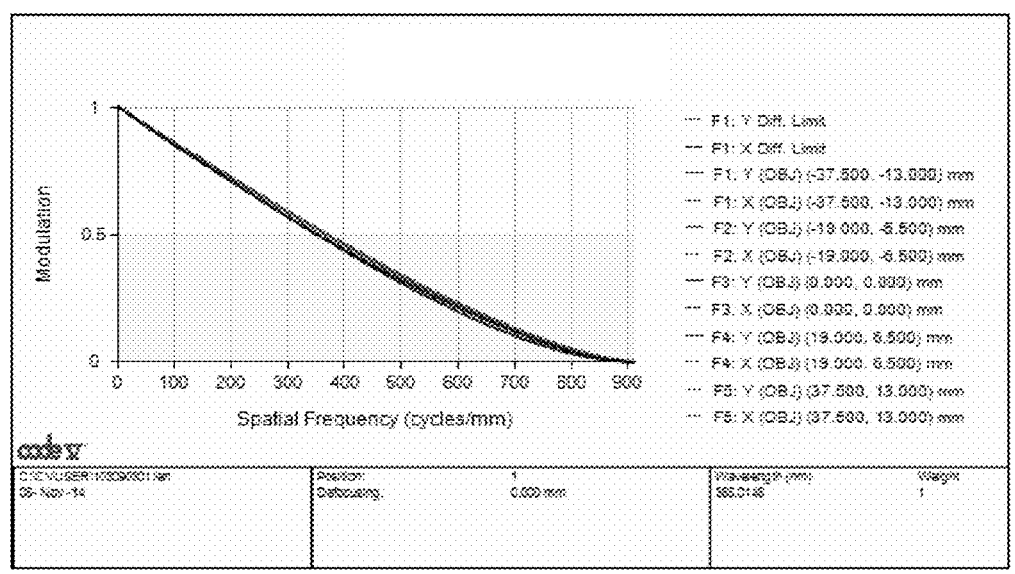
FIG. 4 is a diffraction modulation transfer function curve of the common optical components exposer lens set according to the second embodiment of the present invention.

Subsequently, the paper material is trimmed to form a paper plate 10a having a desired range, as is shown in FIG. 4.

Figure 5:
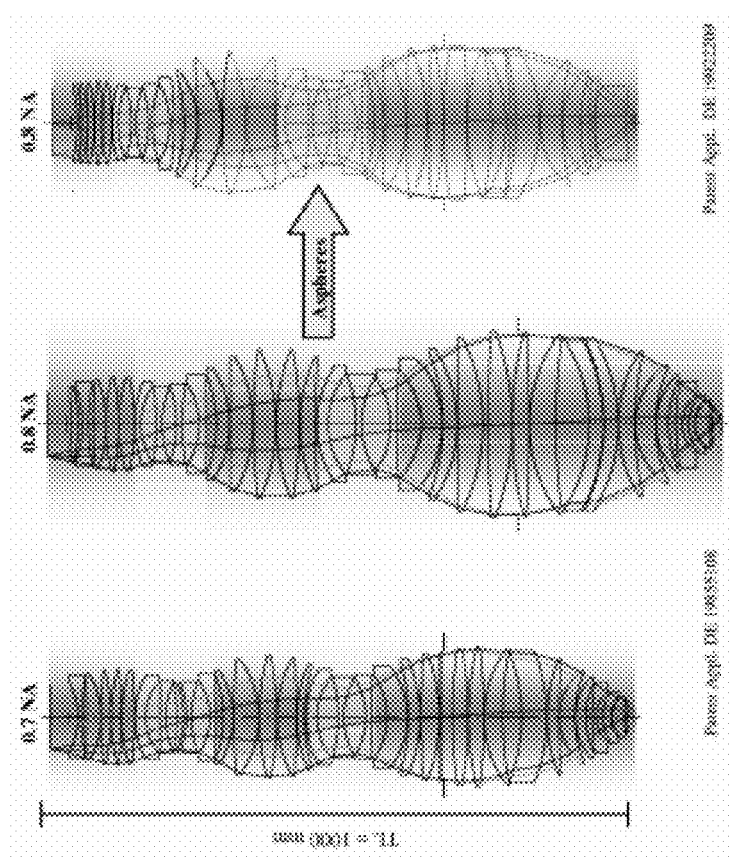
FIG. 5 is a schematic diagram of a cross sectional view of a lens set of a conventional exposer.

Then, the paper plate 10a is formed as an utensil 1, and the hydrophilic PU foaming film 3 is enabled to form a three dimensional pattern area on a surface of the utensil by being heated and thus foaming with a heating temperature presenting when the utensil 1 is formed, where the temperature is provided from 250 to 350° C. for less than two seconds to enable the hydrophilic PU foaming film 3 to completely foam, thereby forming a three dimensional pattern area 3a on a surface of the utensil 1, as is shown FIG. 5. At this time, the hydrophilic PU foaming film 3 becomes to have a thickness of at least six times after being heated within the short time period to form the three dimensional pattern area 3a.

Figure 6:
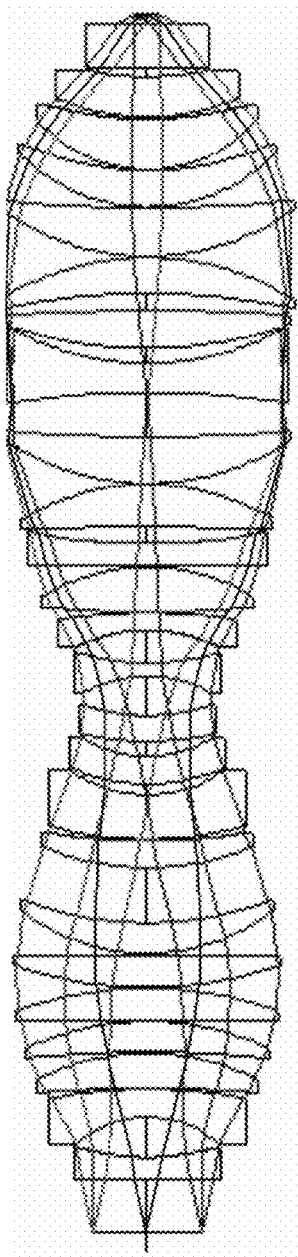
FIG. 6 is a schematic diagram of a cross sectional view of another lens set of the conventional exposer.
Figure 7:
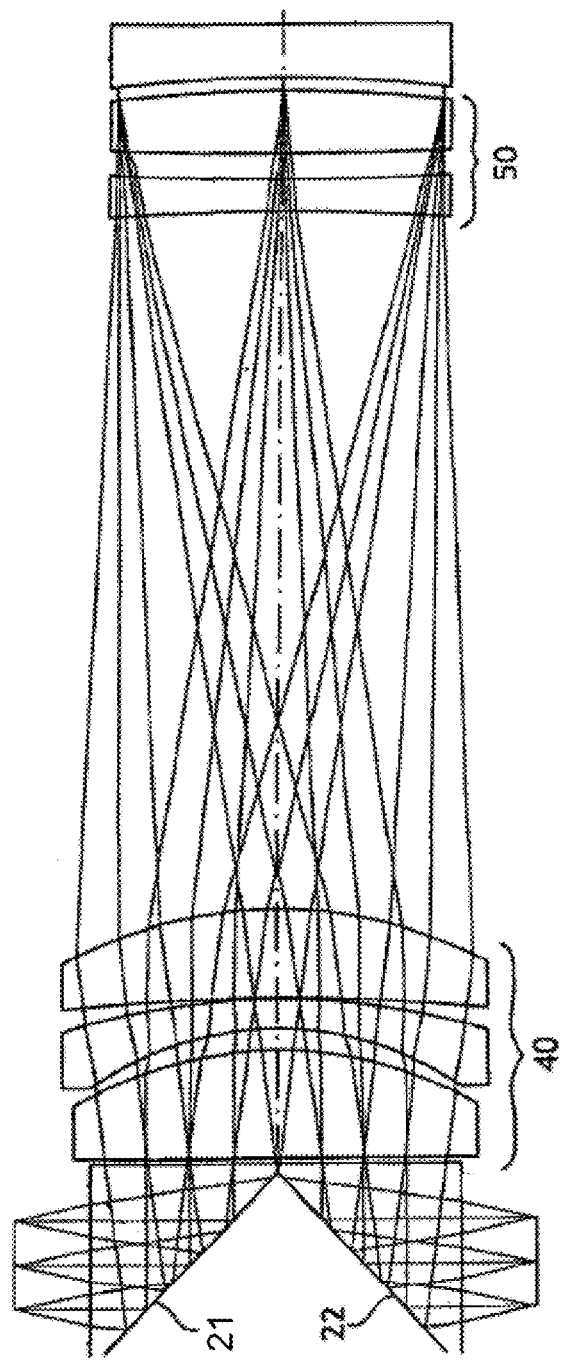
FIG. 7 is a schematic diagram of a cross sectional view of a lens set of yet another conventional exposer.
Figure 8:
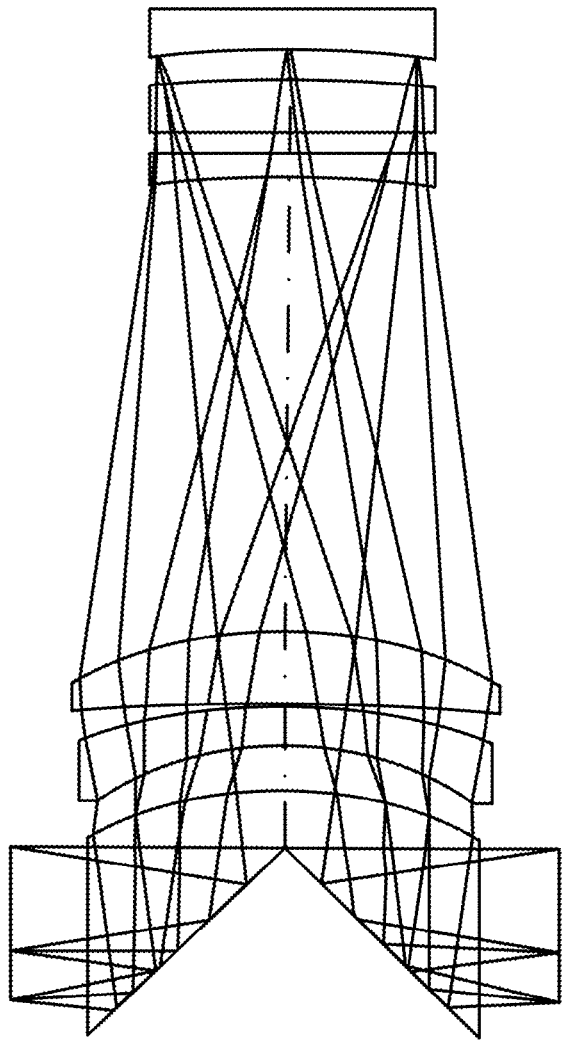
FIG. 8 is a schematic diagram of a cross sectional view of still another lens set of the conventional exposer. lens set 40, 50

As such, the three dimensional pattern area 3a may be directly formed onto the surface of the utensil immediately by using the hydrophilic PU foaming film, without requiring an additional binding agent. Furthermore, such formed bubbler has the efficacies of an increased thickness, a better hydrolysis proofing, a better scrape proofing, and a better heat isolation. The utensil 1 may be a paper made cup, a paper made tray, or a paper made dinner pail, as is shown in FIG. 6 and the paper made cup in this embodiment as an example. As such, a novel method for fabricating a bubbler is completely provided.

In summary, the method for fabricating a bubbler of the present invention may effectively overcome the shortcoming encountered in the prior art, in which the three dimensional pattern area may be directly formed onto the surface of the utensil by using the hydrophilic PU foaming film without requiring the binding agent, so as to increase a fabricating speed and reduce a fabricating cost, and further have an increased thickness, a better hydrolysis proofing, a better scrape proofing, and a better heat isolation.

From all these views, the present invention may be deemed as being more effective, practical, useful for the consumer's demand, and thus may meet with the requirements for a patent.

The above described is merely examples and preferred embodiments of the present invention, and not exemplified to intend to limit the present invention. Any modifications and changes without departing from the scope of the spirit of the present invention are deemed as within the scope of the present invention. The scope of the present invention is to be interpreted with the scope as defined in the claims.

What is claimed is:

1. A non-spherical optical components exposer set, comprising:
    an optical lens set, comprising a first lens, a second lens, and a third lens arranged sequentially, forming a trilens, the first lens being non-spherical, the first and third lens having a positive curvature while the second lens has a negative curvature, the first and third lens having a curvature ratio ranged between 3 and 4, the third and second lenses having a curvature ratio ranged between −1 and 2.5;
    a spherical reflecting mirror, arranged below the third lens, to reflect a light path and control a dimension of a numerical aperture; and
    a planar reflecting mirror set, comprising a first planar reflecting mirror and a second planar reflecting mirror, inclinedly arranged above the first lens to guide the light path and wherein each of adjacent lens among the first, second, and third lens have a pitch smaller than a pitch between the third lens and the reflecting mirror set, so that an equi-multiplication exposer set is formed so as to impinge a pattern of an object onto a photosensitive surface after being focused by the spherical reflecting mirror, the optical lens set, and the planar reflecting mirror set.

2. The non-spherical optical components exposer set as claimed in claim 1, wherein the optical lens set is calibrated for an aberration thereof.

3. The single non-spherical optical components exposer set as claimed in claim 1, wherein the object is an exposure mask or a write light source.

4. The non-spherical optical components exposer set as claimed in claim 1, wherein light corresponding to the pattern of the object is focused by passing through the first, second, and third lens, wherein after the light enters the first, second and third lens having a non-spherical face at a side thereof, the light reflects off the spherical reflecting lens and travels through the third, second, and first lens in a reverse direction, and finally reflects off of the first and second planar reflecting lens, so as to impinge the pattern of the object onto the photosensitive surface.

5. The non-spherical optical components exposer set as claimed in claim 1, wherein the conjugate light path exposer lens set is applicable to a collimated image projector.

6. The non-spherical optical components exposer set as claimed in claim 1, wherein the planar reflecting lens set is selectable to be replaced with a prism or an extended image lens set.

7. The non-spherical optical components exposer set as claimed in claim 1, wherein the first, second, and third lenses are selectable to be replaced with a lens cone to form an optical system assembly having a primary system.

* * * * *